United States Patent [19]

Brun et al.

[11] 4,267,602
[45] May 12, 1981

[54] ACQUISITION DELAY CIRCUIT FOR A PLL REFERENCE OSCILLATOR

[75] Inventors: Craig W. Brun, Honeoye Falls; Wilfred L. Hand, Clarence, both of N.Y.

[73] Assignee: GTE Products Corporation, Stamford, Conn.

[21] Appl. No.: 81,751

[22] Filed: Oct. 4, 1979

Related U.S. Application Data

[63] Continuation-in-part of Ser. No. 956,954, Nov. 2, 1978, abandoned.

[51] Int. Cl.³ .................................. H03B 3/06
[52] U.S. Cl. ............................ 455/182; 455/183; 455/173; 455/192; 358/195.1
[58] Field of Search ............... 455/173, 179, 182, 183, 455/192, 195, 196; 331/47; 358/195.1, 191.1, 193.1, 158.1; 332/19; 334/11, 16

[56] References Cited

U.S. PATENT DOCUMENTS

| | | | |
|---|---|---|---|
| 3,440,544 | 4/1969 | Pampel | 455/173 |
| 3,675,146 | 7/1972 | Langham | 331/55 X |
| 3,764,916 | 10/1973 | Merrell | 358/191 X |
| 3,949,158 | 5/1976 | Rzeszewski | 358/195 |
| 4,009,438 | 2/1977 | Grohmann | 455/164 |
| 4,128,849 | 12/1978 | Rhee | 358/195 X |
| 4,208,741 | 8/1980 | Brun et al. | 455/180 |

Primary Examiner—Jin F. Ng
Assistant Examiner—Tommy P. Chin
Attorney, Agent, or Firm—John A. Odozynski

[57] ABSTRACT

A delay circuit for enhancing acquisition of a synthesizer PLL subsequent to change in the synthesizer's frequency of operation or a change in the source of tuning voltage applied to a voltage-controllable reference oscillator. A control circuit determines whether the reference oscillator operates in a crystal-controlled or in a voltage-controlled mode. The delay circuit includes a monostable having an output coupled to the control circuit and a trigger input coupled to both an ENTER CHANNEL indicator and a pulse generator. The monostable is triggered, thereby assuring temporary crystal-controlled operation of the reference oscillator, in response to an ENTER CHANNEL indicator or to an output from a pulse generator. The pulse generator is responsive to a change in the source of reference oscillator tuning control voltage from, for example, a manually variable fine tuning potentiometer to an AFC control circuit.

18 Claims, 1 Drawing Figure

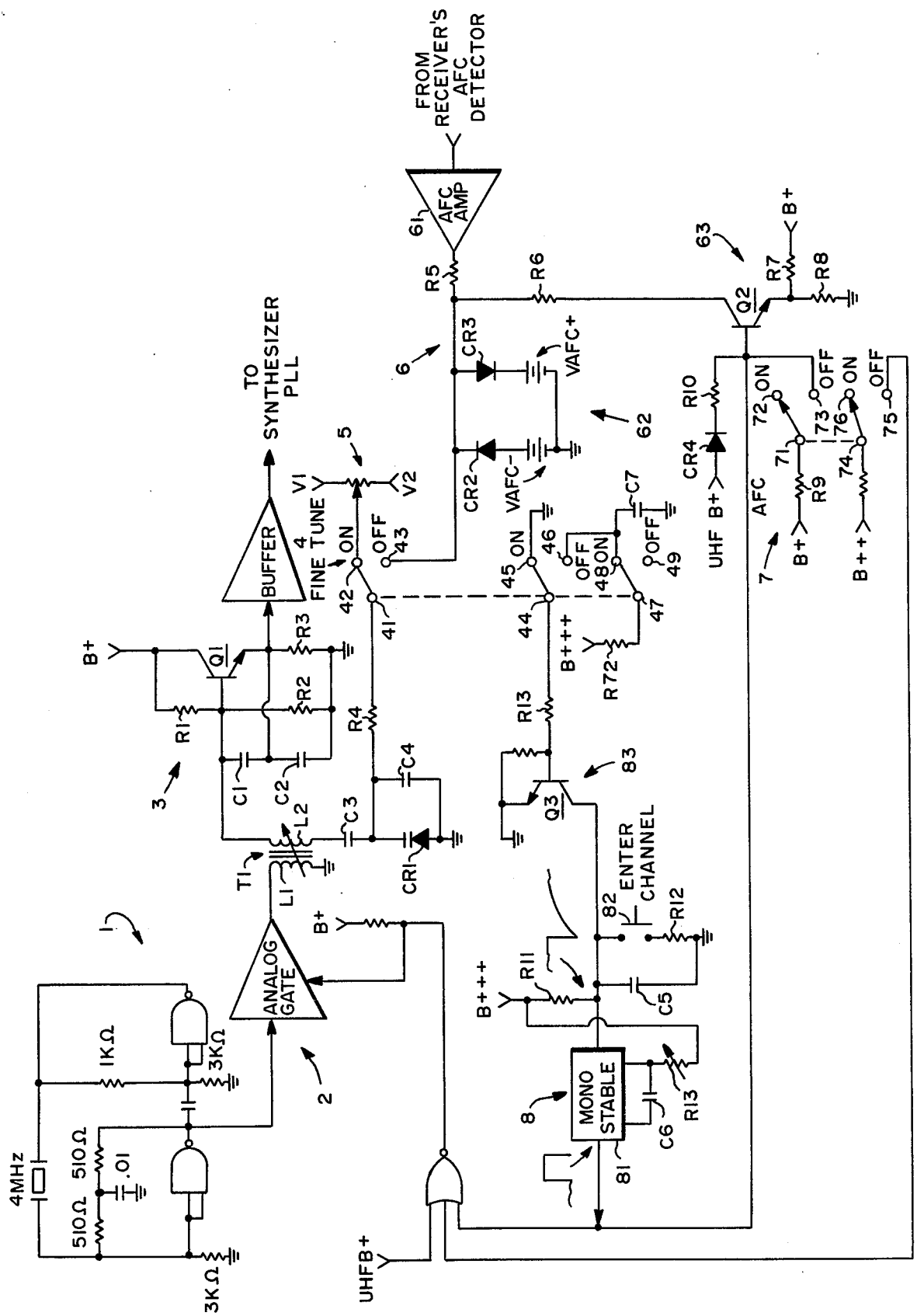

ACQUISITION DELAY CIRCUIT FOR A PLL REFERENCE OSCILLATOR

CROSS-REFERENCE TO RELATED APPLICATIONS

This application is a Continuation-in-Part of Ser. No. 956,954, filed Nov. 2, 1978, now abandoned.

Cross-reference is made to the related application "AFC System for a Synthesizer Tuning System", Ser. No. 956,955, also filed on Nov. 2, 1978 and assigned to the same assignee as this invention, now U.S. Pat. No. 4,208,741.

TECHNICAL FIELD

This invention relates to synthesized tuning systems and more particularly to a circuit for injection locking a voltage-controllable reference oscillator to a crystal-controlled oscillator subsequent to a change in the source of the tuning control voltage.

BACKGROUND ART

It has been found expedient in the design of many state-of-the-art television receivers to utilize frequency synthesis techniques in the generation of the tuner's local oscillator signal. In particular, in a Phase-Locked Loop (PLL) synthesizer, a very stable, usually crystal-controlled reference signal is phase/frequency compared with the signal developed by a voltage-controlled oscillator (VCO). The voltage output of the comparator is appropriately filtered and coupled to the VCO so that its output frequency is locked and substantially equal to the operating frequency of the reference oscillator. In general the reference oscillator signal is divided by a fixed divider and the output of the VCO is divided by a variable divider, according to the desired frequency of operation, so as to supply the desired frequencies to the phase/frequency comparator. In a particular synthesizer system used in conjunction with the subject invention, a 4 MHz crystal-controlled reference oscillator is divided by a factor of 512 to produce a fixed reference frequency of 7.8125 KHz at one input of the phase/frequency comparator. The local oscillator frequency, at 45.75 MHz above the nominal picture carrier frequency for a given channel, is then divided by an appropriate factor to produce a signal of the same nominal frequency at the other input of the comparator. For example, the Channel 2 picture carrier is at 55.25 MHz and the receiver's local oscillator should be at 101 MHz. The appropriate divider factor is then 101 MHz/7.8125 KHz, or 12928. This factor can be implemented by a fixed divider at 64 followed by a variable divider set at 202. In a properly operating PLL synthesizer, any error in the receiver's local oscillator frequency will result in an output that will tend to equalize the frequencies of the signals at the input to the phase/frequency comparator, thereby correcting the local oscillator frequency.

It is clear that the system described above is satisfactory when the receiver is receiving signals whose picture carrier is at the frequency specified by the FCC for a given channel. In this situation the PLL operation will assure the desired local oscillator frequency and the picture and sound carriers will be substantially exactly converted to the standard IF frequencies, 45.75 MHz and 41.25 MHz respectively. However, when the television receiver is operating from sources, such as some CATV and MATV systems, that provide nonstandard carrier signal frequencies, the preprogrammed divider ratios described above will result in the conversion of the carrier signals to frequencies other than 45.75 and 41.25 MHz. In some cases the deviation from the specified standard frequencies may be as much as ±1 MHz. Those familiar with the design and operation of television receiver circuitry are aware that, because of the frequency selectivity of the receiver's signal processing circuitry, a significant deterioration of both picture and sound quality will likely result.

Prior art circuits that have indicated an awareness of and attempt to confront the above anomalies have not been entirely successful. For example, systems that switch from a crystal-controlled reference oscillator to some other, say, voltage-controllable reference when receiving a nonstandard signal, tend to lose tuning when the carrier signal is lost during the transition from crystal-controlled to voltage controlled reference oscillator operation. The momentary loss of tuning may be so significant so as to preclude subsequent reacquisition, thereby rendering the dual reference oscillator system fatally ineffective.

OBJECTS OF THE INVENTION

It is an object of this invention to enhance the the acquisition characteristics of a voltage-controllable PLL reference oscillator for a synthesized tuner.

It is a further object of this invention that acquisition be enhanced subsequent to a change in the tuner's operating channel.

It is a further object of this invention that acquisition be enhanced when the source of tuning voltage is switched from, for example, a fine tuning circuit to an AFC control circuit.

It is a further object of this invention that the reference oscillator be temporarily injection-locked to a crystal-controlled oscillator during the events described above.

SUMMARY OF THE INVENTION

The above and other objects and advantages are achieved in one aspect of this invention by an acquisition delay circuit comprising a triggerable monostable having an output coupled to a control circuit for a voltage-controllable reference oscillator. The monostable trigger input is coupled to a trigger network responsive to both a channel entering indicator and a fine tuning pulse generator so that the reference oscillator is temporarily injection locked to a crystal-controlled oscillator when a synthesizer channel is selected or when the source of reference oscillator tuning control voltage is changed.

BRIEF DESCRIPTION OF THE DRAWING

The sole drawing is a schematic diagram of a PLL reference oscillator incorporating the subject acquisition delay circuit.

BEST MODE FOR CARRYING OUT THE INVENTION

For a better understanding of the present invention, together with other and further objects, advantages and capabilities thereof, reference is made to the following disclosure and appended claims in connection with the above description of some of the aspects of the invention.

As illustrated in FIG. 1, the 4 MHz output of the crystal-controlled oscillator 1 is coupled to the input of an analog gate 2. The crystal-controlled oscillator may be constructed from a pair of dual-input NAND gates, for example, a standard integrated circuit type SN7400 or equivalent, and external components, including an appropriate 4 MHz crystal, as shown. The analog gate may be in one of many forms but will have an enabling input at which will be applied a voltage of a particular logic level. When a logic ZERO level appears at the enabling input, the gate is enabled; that is, the crystal oscillator output is coupled to the primary winding L1 of transformer T1. Conversely, when a logic ONE level appears at the enabling input, the gate will be disabled; that is, T1 and its associated circuitry will be isolated from the crystal-controlled oscillator. In a manner to be described in detail below, the voltage at the analog gate enabling input is determined by a control circuit comprising a multiple-input NOR gate 21. The output of the NOR gate is coupled through a resistor to a source of voltage, B+. When any of the inputs to the NOR gate is a logic ONE level, its output will be pulled to ground, the analog gate will be enabled, and the 4 MHz output of the crystal-controlled oscillator will appear across the primary winding of T1. Conversely, when all the inputs to the NOR gate are at a logic ZERO level, the output of the NOR gate will be at a logic ONE level, the analog gate will be disabled, and T1 and its associated circuitry will be isolated from the output of the crystal-controlled oscillator.

The secondary of T1 includes an inductance L2 of the voltage-controllable oscillator 3. The voltage-controllable oscillator comprises a transistor Q1 which has a collector connected to B+ and a base coupled through bias resistors R1 and R2 to B+ and ground, respectively. The emitter of Q1 is coupled through a resistor R3 to ground. The necessary feedback signal is applied from the emitter to the base of Q1 via capacitors C1 and C2, respectively coupled from the base to emitter of Q1 and from the emitter of Q1 to ground. The oscillator tank circuit is comprised of, in addition to C1 and C2, L2 which is connected at one end to the base of Q1 and coupled at the other through coupling capacitor C3 to a voltage-controlled capacitance, varactor diode CR1. CR1 has a cathode coupled to C3 and an anode connected to ground. A capacitor, C4, is connected in parallel to CR1 so that its capacitance adds to that of CR1, thereby forming a tuned circuit with L2 and establishing the oscillator's natural frequency of oscillation. The output of the oscillator is coupled to a buffer amplifier and therefrom, after the prescribed frequency division, to the reference input of synthesizer phase/frequency comparator.

In the absence of a 4 MHz signal from the crystal-controlled oscillator, the frequency of oscillator 3 will be established by the voltage across diode CR1. The cathode of CR1 is coupled through a resistor R4 of a tuning voltage control terminal, a first pole 41 of voltage applying means in the form of the FINE TUNE switch 4. (Although switch 4 is represented in a conventional mechanical form, it will be obvious that other switching apparatus, either mechanical or electrical, may be used without departing from the scope of this invention.) When the FINE TUNE switch is in the ON position, the pole 41 is connected to a terminal 42 which is in turn connected to a fine tuning circuit 5. The fine tuning circuit comprises, at least, a manually controllable variable resistor connected between first and second voltage references, V1 and V2. In the FINE TUNE ON condition the nominal voltage across CR1 is approximately 10 volts. With L2 equal to 6.5 $\mu$h and values of C1, C2 and C4 equal to 3300 pf, 1500 pf, and 270 pf respectively, oscillator 3 operates at a natural frequency of approximately 4 MHz. As the wiper of the variable resistor is manually adjusted between V1 and V2, the voltage across CR1 and the operating frequency of oscillator 3 will vary accordingly.

With the FINE TUNE switch in the OFF condition, that is, pole 41 connected to terminal 43, the voltage across CR1 is established by an AFC control circuit 6. In this mode of operation the tuner's local oscillator will be locked onto the frequency of the voltage-controllable reference oscillator. Any deviation of the voltage-controllable oscillator from its nominal value of 4 MHz will result in the conversion of the desired channel picture carrier to a frequency other than 45.75 MHz. The receiver's AFC detector will generate a correction voltage in proportion to the frequency error of the converted picture carrier. This voltage will be processed by the AFC control circuit 6 so as to correct the reference oscillator frequency.

Circuit 6 comprises an amplifier 61 having an input coupled to the receiver's AFC detector and an output coupled through a resistor R5 to the FINE TUNE OFF terminal 43 associated with pole 41. Using an RCA integrated circuit AFC detector, part of device CA3136, the input to the AFC amplifier will vary within the nominal range of 1 to 5 volts and its output will vary within the range of approximately 12 to 8 volts.

In order to limit the voltage developed at terminal 43, and hence the receiver's AFC pull-in range, circuit 62 is connected between the output of the AFC amplifier and circuit ground. This circuit operates to restrict the output of the AFC amplifier between the upper and lower limits determined by the reference voltages $V_{AFC}^+$ and $V_{AFC}^-$. Circuit 62 comprises a first diode, CR3, poled in one direction, that is, anode coupled to the AFC amplifier and cathode to $V_{AFC}^{30}$, and a second diode, CR2, poled in the opposite direction, that is, cathode coupled to the AFC amplifier and anode to $V_{AFC}^-$. As the output of the AFC amplifier goes above $V_{AFC}^{30}$, CR3 will become forward-biased and the voltage at terminal 43 will be held at approximately $V_{AFC}^+$. Conversely, as the output of the AFC amplifier goes below $V_{AFC}^-$, CR2 will become forward-biased and the voltage at terminal 43 will be held at approximately $V_{AFC}^-$. The effect will be to limit the AFC pull-in range and insure against false locking into spurious carrier signals such as the associated sound carrier, at 41.25 MHz, and the adjacent sound carrier, at 47.25 MHz.

In some modes of operation, it will be desirable to have the AFC voltage clamped at its nominal value, 10 volts. This is accomplished by a clamping circuit 63 comprising clamping means in the form of transistor Q2 having a collector terminal coupled through a resistor R6 to the output of the AFC amplifier and emitter terminal coupled to a clamping reference voltage. The clamping reference comprises a resistor R7 connected between B+ and the emitter of Q2 and a resistor R8 connected between the emitter of Q2 and ground. With B+ equal to 28 volts and values for R7 and R8 equal to 1.8K ohms and 1.0K ohms respectively, the voltage at the emitter of Q2 will be approximately 10 volts. When a logic ONE level appears at the input (base) of Q2, Q2 will become saturated and the voltage at terminal 43 will be clamped at approximately 10 volts, regardless of the operation of the AFC amplifier. The clamp will be operative, that is, close-circuited, when an AFC switch 7 is in its OFF condition; that is, when its pole 71 is connected to terminal 73. In this condition the base of Q2 will be coupled through R9 to B+. When the AFC switch is in the ON position, pole 71 connected to terminal 72, terminal 73 will be open-circuited but the clamp may be rendered operative by one of two other operating conditions described below. (As with the FINE TUNE switch, the AFC switch has been represented in conventional mechanical form. It may, however, assume other known configurations without departing from the scope of this invention.)

The operation of the reference oscillator described above is as follows. With the AFC switch in the OFF position, a logic ONE level will appear at the AFC input of gate 21. The logic ONE level will be coupled from a voltage source B++ to a pole 74 of the AFC switch and therefrom to a terminal 75. Pole 74 is connected to terminal 75 when the AFC switch is in the OFF condition and to terminal 76 in the ON condition. The analog gate will be enabled and the 4 MHz output of the crystal-controlled output will be coupled by T1 to the voltage-controllable oscillator. With the FINE TUNE switch in the OFF position, the voltage at the cathode of CR1 will be approximately 10 volts and the oscillator's natural operating frequency will be approximately 4 MHz. However, because of the injection of the 4 MHz signal in the voltage-controlled oscillator tank circuit, it will not necessarily operate at its natural frequency but at a frequency almost precisely equal to 4 MHz. The reference input to the VCO will be fixed at the crystal-controlled oscillator frequency, 4 MHz, and the receiver's local oscillator will be locked to one of the pre-programmed carrier frequencies. However, if for the reasons stated above, it is desirable to have the local osciallator operating at a frequency other than one of the pre-programmed frequencies, the AFC switch may be placed in the ON position. Assuming the analog gate 2 is disabled (it may not be for reasons stated below) the reference oscillator will operate at its natural frequency, as determined by the voltage at the cathode of CR1. With the FINE TUNE switch in the OFF position, any deviation in the frequency of the converted picture carrier from its nominal value, 45.75 MHz, will result in error correction voltage at the output of the receiver's AFC detector, thereby correcting the frequency of the reference oscillator and, because the local oscillator frequency is an integer multiple of the reference oscillator frequency, a correction of the local oscillator frequency. With the FINE TUNE switch in the ON position, the reference and local oscillator frequencies may be manually controlled via the fine tuning circuit 5.

Because MATV and CATV systems do not generally distribute UHF signals and the transmitted UHF signals are always on frequency, it may be desirable to have voltage-variable operation of the reference oscillator only on VHF channels. Consequently the analog gate will be enabled and the voltage at terminal 43 will be clamped whenever a UHF channel is selected. Both these functions are accomplished by virtue of a UHF B+ that is 24 volts during operation on a UHF channel and otherwise zero UHF B+ is coupled to an input of gate 21, thereby enabling the analog gate and injection locking the reference oscillator during UHF reception. UHF B+ is also coupled through a series-connected resistor R10, and diode CR4, to the base of Q2 so as to clamp the voltage at terminal 43 to approximately 10 volts.

A loop acquisition delay circuit 8, comprising a monostable 81 prevents any discontinuity in the synthesizer reference source and also prevents spurious signals detected by the AFC detector from influencing the synthesizer PLL during loop acquisition. This is accomplished by assuring that the reference oscillator is in the injection-locked mode of operation when the viewer selects a channel via the CHANNEL ENTER pushbutton switch 82 or switches the FINE TUNE switch from the ON to OFF position. The monostable, which may be an integrated circuit type SN 74121 or equivalent, has a trigger input coupled to a trigger network comprising a 470-ohm resistor, R11, and a capacitor, C5.

The trigger input is coupled through R11 to B+++ and through a capacitor C5 to ground. The trigger input is also coupled through the CHANNEL ENTER button and a series-connected, 10-ohm, resistor, R12, to ground. A negative-going input pulse at the input to the monostable 81 causes it to generate a positive-going output pulse of a duration determined by capacitor C6 and resistor R13. During steady state operation capacitor C5 is charged through R11 to B+++, approximately 5 volts. When the viewer selects a channel by depressing button 82, C5 is rapidly discharged to ground according to the time-constant established by C5 and R12. For respective values of 0.1 μF and 10 ohms, the discharge time constant is one microsecond. The negative-going voltage at the input device 81 causes a positive-going pulse to appear at its output. This pulse is coupled to an input of gate 21, thereby enabling the analog gate and assuring injection-locked operation of reference oscillator. The output is also coupled to the base of Q2, thereby clamping the voltage at terminal 43 to ten volts. After the monostable pulse duration the reference oscillator returns to the voltage-controlled mode of operation, provided that the AFC switch is in the ON position.

The delay circuit also includes a second section (pole 44 and associated terminals 45 and 46) and a third section (pole 47 and terminals 48 and 49) of the FINE TUNE switch. The three sections of the FINE TUNE switch are mechanically coupled, that is, ganged, and the second and third sections are used to drive a fine tuning pulse generator 83 so that whenever the FINE TUNE switch goes from its ON to OFF condition an acquistion delay pulse is generated as described above. Pulse generator 83 comprises a transistor Q3 that has a collector coupled to the input of the monostable, an emitter connected to ground and a base coupled through a resistor R13 to a pole 44 of the FINE TUNE switch. When the FINE TUNE switch is in the ON position pole 44 is connected to a terminal 45 which is in turn connected to ground. The FINE TUNE switch has a third pole 47 coupled through a resistor to B+++. When the FINE TUNE switch is in the ON position pole 47 is connected to a terminal 48 which is wired to a terminal 46. These terminals are coupled through a 5.0 μf capacitor C7 to ground. With the FINE TUNE switch in the ON condition both C5 and C7 are charged to approximately B+++. When the FINE TUNE switch is switched to the OFF condition, pole 44 becomes connected to terminals 46 and 48. The charge on C7 will provide base current Q3 and Q3 will become conductive, thereby rapidly discharging C5 to ground. As before, the negative-going pulse will trigger monostable 81, resulting in an acquisition delay pulse at the input of gate 21 and the base of Q2. After a period of time C7 will be discharged, Q3 will become nonconductive, and C5 will be charged through R11 to B+++. When the FINE TUNE switch is retuned to the ON condition C7 will be likewise charged through R72 to B+++. Subsequent switching to the OFF state will again trigger the monostable.

It is clear that, although the delay circuit is shown to include the second and third sections of the FINE TUNE switch as the means by which a change in the source of tuning voltage (from the fine tuning circuit to the AFC control circuit) is detected and indicated, this function can be implemented with other forms of circuitry. In particular, electronic, rather than mechanical, devices can conveniently be used in place of the second and third sections of the FINE TUNE switch. In addition, it would be possible to have these devices electrically coupled to the FINE TUNE switch, rather than mechancially ganged as shown. Finally, it should be noted that some synthesizer systems provide an output signal indicating whether the PLL acquisition has occurred. If such a signal is available, it can be used to trigger the monostable or, alternatively, as an input to the NOR gate and to the base of Q3.

As is apparent from the description above, the subject invention effects a highly stable, yet flexible, reference oscillator for a synthesized tuning system. When processing signals at the standard specific frequencies, the reference osciallator operates in a highly stable, crystal-controlled, injection-locked mode and AFC correction or fine tuning capability will not normally be required. In this mode the local oscillator frequency will be discrete rational multiples of the crystal-controlled oscillator frequency. When processing signals at nonstandard frequencies, the reference oscillator operates in a voltage-controlled mode and its output frequency is continuously variable according to the voltage applied at its tuning voltage control terminal. The tuning voltage may be selectively supplied from a manually variable fine tuning circuit or automatically from an AFC voltage control circuit. The reference oscillator circumvents problems associated with PLL discontinuities that occur when changing channels or switching the source of tuning voltage for the voltage-controllable oscillator.

Nevertheless, while there has been shown and described what are at present considered the preferred embodiments of the invention, it will be obvious to those skilled in the art that various changes and modifications may be made therein without departing from the scope of the invention as defined by the appended claims.

What is claimed is:

1. In a PLL synthesizer tuning system for generating frequencies according to the desired channel of operation, said system having a reference oscillator selectively operable either in a crystal-controlled, injection-locked mode or in a voltage-controlled, mode, wherein the reference oscillator operating frequency is determined by a tuning voltage applied to a tuning voltage control terminal of said oscillator, alternatively supplied said toning voltage either by a manually-variable fine tuning circuit or by an AFC control circuit, and having a control circuit for determining the mode of operation of the reference oscillator, an acquisition delay circuit for assuring PLL acquisition in the voltage-conrolled mode, said delay circuit comprising:

a monostable having a trigger input responsive to edges of trigger pulses of a particular polarity and an output coupled to the control circuit, and a trigger network coupled to the trigger input, said network including means for triggering the monstable in response to a change in the synthesizer's channel of operation.

2. A delay circuit as defined in claim 1 wherein the trigger network comprises:

a first resistance coupled between the trigger input and a source of voltage, a capacitance coupled between the trigger input and a reference potential, an ENTER CHANNEL switch having a first terminal coupled to the trigger input;

a second resistance coupled between a second terminal of the CHANNEL ENTER switch and the reference potential, the terminals of the CHANNEL ENTER switch being normally open but closed during the selection of a channel so that when the switch is open the capacitance is charged through the resistance and when the switch is closed the capacitance is discharged through the switch and the second resistance, thereby triggering the monostable.

3. A delay circuit as defined in claim 2 wherein the first and second resistances are resistors, the first resistor having a value several times greater than the second resistor so that the capacitance is charged more slowly than dicharged.

4. An acquisition delay circuit as defined in claim 1 for a reference oscillator having a tuning control terminal coupled to a first pole (41) of a FINE TUNE switch whereby in the FINE TUNE ON condition the reference oscillator tuning voltage is supplied by the fine tuning circuit and in the FINE TUNE OFF condition the tuning voltage is supplied by the AFC control circuit, said delay circuit further including a fine tuning pulse generator comprising:

at least a second pole (44) ganged to the first pole (41) of the FINE TUNE switch, a terminal (45) associated with the second pole and coupled to a reference potential, and a semiconductor device coupled between the trigger input and the second pole (44) so that when the FINE TUNE switch is in the ON condition the input of the semiconductor device is coupled to the terminal (45) and therefore presents a high impedance at the trigger input.

5. An acquisition delay circuit as defined in claim 4 wherein the fine tuning pulse genertor further comprises:

a third pole (47) of the FINE TUNE switch, ganged to the first and second poles and resistively coupled to a potential voltage on associated terminals (48) corresponding to the FINE TUNE ON condition; and a capacitance connected between terminal 48 and the reference potential, the capacitance charged to the potential voltage when the FINE TUNE switch is in the ON condition.

6. An acquisition delay network as defined in claim 5 further comprising a terminal 46 associated with the second pole, corresponding to the OFF condition, and coupled to terminal 48 so that when the FINE TUNE switch is in the ON condition the second pole is coupled to the capacitance whereby when the FINE TUNE switch goes from the ON to the OFF condition the capacitance temporarily supplies input current to the semiconductor device resulting in a low impedance at the trigger input and thereby discharging the capacitance of the trigger network and triggering the monostable.

7. In a PLL synthesizer having a reference oscillator alternately operable in either a crystal-controlled mode or in a voltage-controlled mode as determined by a control circuit having an output coupled to the reference oscillator and, where in the voltage-controlled mode, the reference oscillator is selectively controllable by one of at least either a first or a second source of tuning voltage as selected by voltage applying means coupled between a reference oscillator tuning control terminal and the sources of tuning voltage, an acquisition delay circuit for enhancing PLL acquisition subsequent to a selection in the source of tuning voltage, the acquisition delay circuit comprising:
  switching means coupled to the voltage applying means for detecting and indicating a selection in the source of tuning voltage,
  a pulse generator having an input coupled to the switching means, and
  a monostable having a trigger input coupled to an output of the pulse generator and an output coupled to the input of the control circuit, so that subsequent to a selection in the source of tuning voltage the pulse generator develops an output pulse thereby triggering the monostable and assuring that the reference oscillator operates in the crystal-controlled mode for a period of time equivalent to the monostable output pulse duration.

8. A circuit as defined in claim 7 wherein the pulse generator comprises a semiconductor device having an input coupled to the switching means and an output coupled to the trigger input.

9. A circuit as defined in claim 8 wherein the switching means is characterized by an OFF condition when a source of tuning voltage is selected and otherwise characterized by an ON condition and wherein the switching means comprises first and second poles, respective first terminals associated with the ON condition and respective second terminals associated with the OFF condition, the first pole being connected to the semiconductor device and the first ON terminal coupled to a reference potential so that the semiconductor device is rendered nonconductive when the switch is in the ON condition.

10. A circuit as defined in claim 9 wherin the second pole is resistively coupled to a voltage, the first OFF terminal is connected to the second ON terminal, and the second ON terminal is coupled through a capacitor to the reference potential so that when the switching means goes from the ON to the OFF condition the capacitor temporarily supplies input current to the semiconductor device, whereby the device becomes conductive thereby triggering the monostable.

11. A circuit as defined in claim 10 wherein the semiconductor device is a transistor having a collector coupled to the trigger input, a base coupled to the swiching means, and an emitter coupled to the reference potential.

12. A circuit as defined in either claim 7 or claim 9 further comprising triggering means for assuring that the reference oscillator temporarily operates in the injection-locked mode immediately subsequent to a change in the synthesizer operating channel, said triggering means comprising an ENTER CHANNEL indicator switch coupled to the monostable trigger input.

13. A circuit as defined in claim 12 wherein said triggering means further comprises a charging resistance coupled between the trigger input and a voltage supply and a capacitance coupled between the trigger input and a reference potential so that the capacitance is charged through the charging resistance.

14. A circuit as defined in claim 13 wherein the CHANNEL ENTER switch has one terminal coupled to the trigger input and another terminal coupled to the reference potential through a discharging resistance so that during an ENTER CHANNEL switching the capacitance is discharged through the discharging resistance, thereby triggering the monostable.

15. A circuit as defined in claim 14 wherein the CHANNEL ENTER switch is a manually operated switch.

16. A circuit as defined in claim 15 wherein the value of the charging resistance is at least several times greater than the value of the discharging resistance.

17. An acquisition delay circuit for a voltage-controllable PLL reference oscillator including a controllable tuning control terminal at which is applied a voltage as selected from a plurality of sources of tuning voltage by a voltage applying means, said circuit comprising:
  a monostable,
  a trigger network coupled to the input of the monostable,
  switching means coupled to the voltage applying means, said switching means for detecting and indicating a selection in the source of tuning voltage, and
  a pulse generator having an input coupled to the switching means and an ouput coupled to the trigger network for triggering the monstable subsequent to a change in the source of tuning voltage.

18. A circuit as defined in claim 17 further comprising CHANNEL ENTER means for triggering the monostable subsequent to the selection of an operating channel.

* * * * *

UNITED STATES PATENT AND TRADEMARK OFFICE
CERTIFICATE OF CORRECTION

PATENT NO. : 4,267,602

DATED : May 12, 1981

INVENTOR(S) : CRAIG W. BRUN AND WILFRED L. HAND

It is certified that error appears in the above—identified patent and that said Letters Patent is hereby corrected as shown below:

Col. 7, line 62, after "oscillator" add --voltage supply means--;

line 62, change "supplied" to --supplying--;

line 63, change "toning" to --tuning--;

Claim 3, line 5, change "dicharged" to --discharged--;

Claim 10, line 1, change "wherin" to --wherein--;

Col. 10, line 13, after "ENTER CHANNEL" delete --indi---;

line 14, delete --cator--.

Signed and Sealed this

Twenty-fourth Day of April 1984

[SEAL]

Attest:

Attesting Officer

GERALD J. MOSSINGHOFF

Commissioner of Patents and Trademarks